United States Patent
Ito et al.

(10) Patent No.: US 9,206,513 B2
(45) Date of Patent: Dec. 8, 2015

(54) APPARATUS FOR FORMING DEPOSITED FILM

(75) Inventors: Norikazu Ito, Higashiomi (JP); Koichiro Niira, Higashiomi (JP); Shinichiro Inaba, Higashiomi (JP)

(73) Assignee: KYOCERA Corporation, Kyoto (JP)

(*) Notice: Subject to any disclaimer, the term of this patent is extended or adjusted under 35 U.S.C. 154(b) by 719 days.

(21) Appl. No.: 13/510,914

(22) PCT Filed: Nov. 22, 2010

(86) PCT No.: PCT/JP2010/070803
§ 371 (c)(1),
(2), (4) Date: May 18, 2012

(87) PCT Pub. No.: WO2011/062286
PCT Pub. Date: May 26, 2011

(65) Prior Publication Data
US 2012/0228129 A1    Sep. 13, 2012

(30) Foreign Application Priority Data

Nov. 20, 2009  (JP) ................................. 2009-264673
Jan. 29, 2010  (JP) ................................. 2010-017648

(51) Int. Cl.
*C23C 14/26* (2006.01)
*C23C 16/455* (2006.01)
(Continued)

(52) U.S. Cl.
CPC ............ *C23C 16/45574* (2013.01); *C23C 16/24* (2013.01); *C23C 16/4405* (2013.01);
(Continued)

(58) Field of Classification Search
CPC .................................................. H01J 37/3244
See application file for complete search history.

(56) References Cited

U.S. PATENT DOCUMENTS

2003/0176011 A1*  9/2003  Niira et al. ...................... 438/96
2005/0109460 A1   5/2005  DeDontney et al.
(Continued)

FOREIGN PATENT DOCUMENTS

JP   2002-359232 A   12/2002
JP   2003-173980 A    6/2003
(Continued)

OTHER PUBLICATIONS

Office Action dated Dec. 3, 2013, issued in counterpart Japanese Application No. 2011-541988.
(Continued)

*Primary Examiner* — Jason M Berman
(74) *Attorney, Agent, or Firm* — Procopio, Cory Hargreaves and Savitch, LLP.

(57) ABSTRACT

First and second electrodes are apart from each other in a chamber. Plates are disposed on a substrate in the second electrode. Each of the plates comprises first and second parts for supplying first and second gas to a space between the first and second electrodes, respectively, a first supply path for first gas connected to the first part, and a second supply path for second gas connected to the second part. The substrate comprises a heater for the first gas, a first introducing path for introducing the first gas to the first supply path, and a second introducing path for introducing the second gas to the second supply path. The second supply path comprises a mainstream part without the second part and branch parts with the second part. A connecting portion of the second introducing path and the mainstream part is positioned in an adjacent portion of the plates.

10 Claims, 7 Drawing Sheets

(51) Int. Cl.
- *H01J 37/32* (2006.01)
- *C23C 16/24* (2006.01)
- *C23C 16/44* (2006.01)
- *C23C 16/452* (2006.01)
- *C23C 16/505* (2006.01)
- *H01L 21/02* (2006.01)
- *H01L 31/18* (2006.01)
- *H01L 31/20* (2006.01)

(52) U.S. Cl.
CPC ......... *C23C16/452* (2013.01); *C23C 16/45563* (2013.01); *C23C 16/505* (2013.01); *H01J 37/3244* (2013.01); *H01L 21/0262* (2013.01); *H01L 21/02532* (2013.01); *H01L 21/02573* (2013.01); *H01L 31/1824* (2013.01); *H01L 31/202* (2013.01); *Y02E 10/545* (2013.01)

(56) References Cited

U.S. PATENT DOCUMENTS

2005/0217580 A1 10/2005 Dedontney et al.
2009/0133631 A1* 5/2009 Wieder .................... 118/723 R

FOREIGN PATENT DOCUMENTS

| JP | 2003-273023 A | 9/2003 |
| JP | 2007-525822 A | 9/2007 |

OTHER PUBLICATIONS

International Preliminary Report on Patentability issued for International Application No. PCT/JP2010/070803.

* cited by examiner

S1

S2

S3

S4

F I G. 9
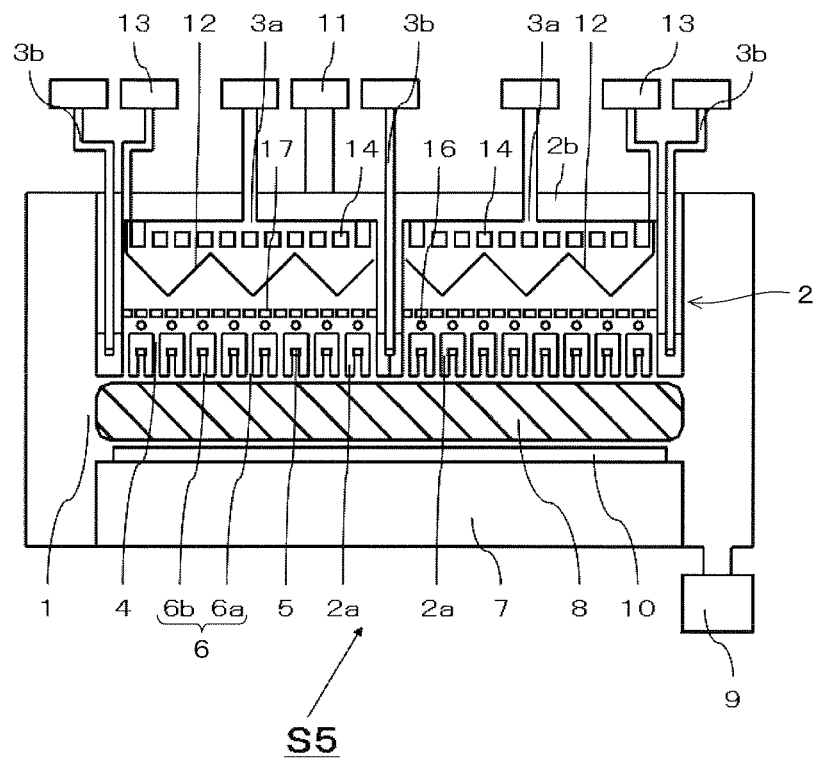

F I G. 1 1
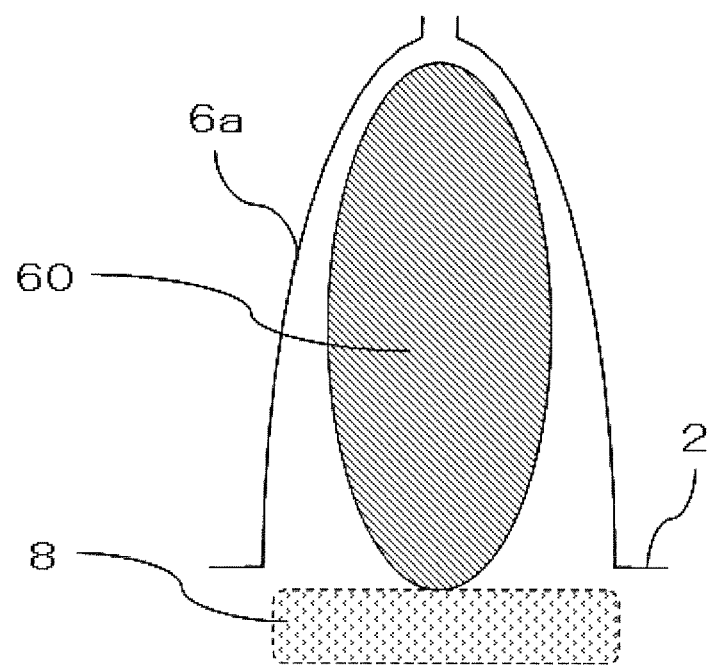

APPARATUS FOR FORMING DEPOSITED FILM

TECHNICAL FIELD

The present invention relates to an apparatus for forming a deposited film such as an Si (silicon) based film on a substrate.

BACKGROUND ART

For example, it is important to form an Si based thin film having a high quality at a high speed in order to reduce a manufacturing cost in a manufacture of a thin film Si based solar cell. A method of forming the Si based thin film at a comparative low temperature of a substrate which is equal to or higher than 100° C. and is equal to or lower than 400° C. is roughly divided into a plasma CVD (Chemical Vapor Deposition) method and a thermal catalyst CVD method (including a method having an identical principle, for example, an HW (Hot Wire)-CVD method or the like).

The plasma CVD method uses a plasma, thereby damaging a deposited film by charged particles, such as ions and electrons. For this reason, there is a fear that a film quality of a deposited film might be degraded.

On the other hand, the thermal catalyst CVD method does not use the plasma. Therefore, it is possible to form a deposited film at a high speed comparatively easily without damaging the deposited film due to charged particles in principle. However, an excessive decomposition of a material gas (for example, an $SiH_4$ gas) is caused by a heated catalyzer which is heated to a high temperature so that a generation of $SiH_2$, SiH and Si causing a degradation in a film quality progresses. For this reason, the film quality obtained by the thermal catalyst CVD method is lower than the film quality obtained by the plasma CVD method.

For the problems, the applicant has proposed a gas separation type plasma CVD apparatus in which advantages of the plasma CVD method and the thermal catalyst CVD method are combined (for example, see Japanese Patent Application Laid-Open No. 2003-173980).

According to the apparatus, a material gas having a low decomposition probability, for example, an $H_2$ gas can be introduced into a chamber while decomposing and activating an $H_2$ gas via a gas supply path in which a mechanism for enhancing a decomposition probability represented by a heated catalyzer is provided.

Therefore, it is possible to cause the $H_2$ gas to contribute to a formation of a microcrystalline silicon film without increasing charged particles which degrade the film quality that is a problem in the plasma CVD method. In addition, a material gas having a high decomposition probability such as the $SiH_4$ gas is introduced into a chamber via another gas supply path in which a heated catalyzer is not provided. Therefore, it is possible to cause the $SiH_4$ gas to contribute to a formation of a deposited film while suppressing the generation of $SiH_2$, SiH and Si which degrade the film quality in the thermal catalyst CVD method. As a result, the gas separation type plasma CVD apparatus can form a film having a high quality at a high speed.

SUMMARY OF THE INVENTION

Problems to be Solved by the Invention

The gas separation type plasma CVD apparatus has a characteristic that a material gas is separated and supplied depending on a gas decomposition probability. On a deposited film forming condition, therefore, a necessary flow rate is low so that a sufficient material gas cannot be supplied uniformly in some cases. For example, in a formation of a microcrystalline silicon film, a flow rate of an $SiH_4$ gas is lower than a flow rate of an $H_2$ gas, that is, $1/10$ to $1/200$. For this reason, the $SiH_4$ gas is uniformly supplied from a plurality of gas supply parts with difficulty. Furthermore, a deformation is applied by a thermal expansion of an electrode plate so that an in-plane film thickness distribution of the deposited film tends to be ununiform in a large-sized apparatus for forming deposited film having a deposition area which exceeds 1 $m^2$.

It is an object of the present invention to provide an apparatus for forming deposited film capable of forming a deposited film having a uniform film thickness distribution, and particularly, to provide an apparatus for forming deposited film capable of preferably forming an Si based thin film to be used in a thin film Si based solar cell.

Means for Solving the Problems

In order to solve the above problems, the present invention provides an apparatus for forming deposited film comprising a chamber, a first electrode positioned in the chamber and a second electrode positioned apart from the first electrode at a predetermined distance in the chamber, wherein the second electrode comprises an electrode substrate and a plurality of electrode plates disposed on the electrode substrate, each of the electrode plates comprises a first supply part for supplying a first material gas to a space between the first electrode and the second electrode, a second supply part for supplying a second material gas to the space, a first supply path which is connected to the first supply part and into which the first material gas is to be introduced, and a second supply path which is connected to the second supply part and into which the second material gas is to be introduced, the electrode substrate comprises a heater for heating the first material gas, a first introducing path for introducing the first material gas to the first supply path, and a second introducing path for introducing the second material gas to the second supply path, the second supply path comprises a main stream part into which the second material gas is to be introduced from the second introducing path and which is not provided with the second supply part, and a plurality of branch parts into which the second material gas is to be introduced from the main stream part and which is provided with the second supply part, and a connecting portion of the second introducing path and the main stream part is positioned in an adjacent portion of the electrode plates which are adjacent to each other.

Effect of the Invention

According to the apparatus for forming deposited film, it is possible to uniformly supply a material gas having a low flow rate from each supply part into a chamber while suppressing a deformation caused by a thermal expansion of an electrode plate. Consequently, it is possible to form, on a substrate, a deposited film which has a uniform film thickness distribution and is excellent.

BRIEF DESCRIPTION OF THE DRAWINGS

FIG. 9 is a schematic sectional view showing an embodiment of the apparatus for forming deposited film according to the present invention.

FIG. 11 is a schematic sectional view showing an embodiment in an outlet of a first supply part.

EMBODIMENT FOR CARRYING OUT THE INVENTION

An embodiment of an apparatus for forming deposited film according to the present invention will be described below with reference to the drawings.

<Apparatus for Forming Deposited Film>

Figure 1:
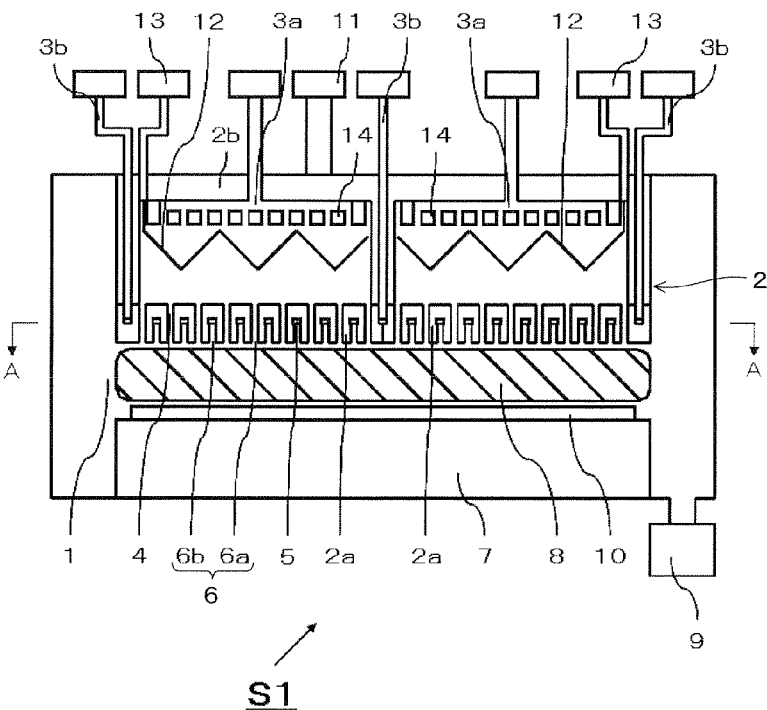
FIG. 1 is a schematic sectional view showing an embodiment of an apparatus for forming deposited film according to the present invention.

As shown in FIG. 1, an apparatus for forming deposited film S1 comprises a chamber 1, a first electrode 7 which is positioned in the chamber 1, and a second electrode 2 which is positioned apart from the first electrode 7 in the chamber 1 at a predetermined distance and functions as a shower electrode. The second electrode 2 is mainly constituted by a plurality of electrode plates 2a and at least one electrode substrate 2b on which the plurality of electrode plates 2a are disposed. In the apparatus for forming deposited film S1, four electrode plates 2a are disposed on one electrode substrate 2b. Moreover, a substrate 10 on which a deposited film is to be formed is disposed between the first electrode 7 and the second electrode 2. It is preferable that the substrate 10 should be positioned between the first electrode 7 and the second electrode 2, and the substrate 10 does not need to be held by the first electrode 7.

The chamber 1 is a reaction vessel with a reaction space which is constituted by at least an upper wall, a peripheral wall and a bottom wall and can be vacuum-sealed. An inner part of the chamber 1 is evacuated by means of a vacuum pump 9 and a pressure in the chamber 1 is regulated by means of a pressure regulator (not shown). The chamber 1 is constituted by a metal member such as stainless or aluminum.

The first electrode 7 has a function of an anode electrode and includes a heater for regulating a temperature of the substrate 10. Thus, the first electrode 7 also functions as a temperature regulating mechanism of the substrate 10, and a temperature of the substrate 10 is regulated to be equal to or higher than 100° C. and to be equal to or lower than 400° C., more preferably, to be equal to or higher than 150° C. and to be equal to or lower than 350° C., for example. The first electrode 7 is constituted by a metal member such as stainless or aluminum.

The substrate 10 to be used can take a shape of a plate which is comprised of a glass or the like, or can take a shape of a film which is comprised of a metallic material, a resin or the like.

A high-frequency power source 11 is connected to the second electrode 2 and a frequency of approximately 13.56 MHz to 100 MHz is applied thereto. In the case in which a film is formed in a large area of 1 m² or more, a frequency of approximately 60 MHz or less is preferably used. By an application of an electric power from the high-frequency power source 11 to the second electrode 2, plasma is formed in a space 8 between the second electrode 2 and the substrate 10.

The second electrode 2 is disposed opposite to the first electrode 7 and functions as a cathode electrode. The electrode plate 2a constituting the second electrode 2 is provided with a first supply path 4 and a second supply path 5 which are to be connected to a plurality of introducing paths 3 (a first introducing path 3a, a second introducing path 3b) and a first supply part 6a and a second supply part 6b which are supply parts 6 for supplying a gas introduced from these supply paths into the chamber 1. These supply parts 6 are opened toward the substrate 10. The first supply part 6a is a portion including a supply port for supplying a first material gas to the space 8 interposed between the first electrode 7 and the second electrode 2, and the second supply part 6b is a portion including a supply port for supplying a second material gas to the space 8. The electrode plate 2a and the electrode substrate 2b are electrically connected to each other, and the electrode plate 2a and the electrode substrate 2b are constituted by metal members such as stainless, an aluminum alloy, a nickel base alloy or the like.

A plurality of gas cylinders (not shown) for storing different gases from each other is coupled to the first supply path 4 and the second supply path 5 via the multiple introducing paths, that is, the first introducing path 3a and the second introducing path 3b. Basically, the gases introduced from the first introducing path 3a and the second introducing path 3b are not mixed with each other until they reach the space 8 via the first supply part 6a and the second supply part 6b, respectively.

The gas to be supplied to the supply parts 6 contains the first material gas and the second material gas having a higher decomposition probability than the first material gas. A total decomposition rate of the gas is defined by $\exp(-\Delta Ea/kTe) \times Ng \times Ne \times ve \times \sigma g$. $\Delta Ea$ represents an excitation and activation energy (dissociation energy) of a material gas, k represents a Boltzmann constant, Te represents an electron temperature, Ng represents a material gas concentration, Ne represents an electron concentration, ve represents an electron velocity, and $\sigma g$ represents a collision cross section of the material gas. Moreover, $\exp(-\Delta Ea/kTe)$ indicates a decomposition probability. Although $\exp(-\Delta Ea/kTe) \times \sigma g$ represents a collision cross section in some cases, it has the same meaning. As will be described later, furthermore, the first material gas flowing through the first introducing path 3a is divided and a part is thus caused to flow to the second introducing path 3b (is mixed with the second material gas) in some cases.

The first material gas and the second material gas are properly selected depending on a type of a deposited film. For example, in the case in which an Si based thin film such as a-Si:H (hydrogenated amorphous silicon) or μc-Si:H (hydrogenated microcrystalline silicon) is formed, a non-Si based gas and an Si based gas can be used as the first material gas and the second material gas, respectively. A hydrogen ($H_2$) gas or the like is used as the non-Si based gas. An $SiH_4$ (silane), $Si_2H_6$ (disilane), $SiF_4$ (silicon tetrafluoride), $Si_2F_6$ (silicon hexafluoride) or $SiH_2Cl_2$ (dichlorosilane) gas or the like is used for the Si based gas. In the case in which a doping gas is introduced, a $B_2H_6$ (diborane) gas or the like is used for a p-type doping gas and a $PH_3$ (phosphine) gas or the like is used for an n-type doping gas. As an introducing path for the doping gas, it is possible to select one of the first introducing path 3a and the second introducing gas 3b if necessary. As will be described later, heating means such as a heated catalyzer is provided in the first introducing path 3a. In the case in which the heated catalyzer 12 is provided as heating means as shown in the drawing, however, it is desirable to introduce the doping gas via the second introducing path 3b.

The heated catalyzer 12 connected to a heating power source 13 can be provided for the heating means as shown in the drawing in the first introducing path 3a, for example. Consequently, the first material gas is heated and activated by the heated catalyzer 12 heated to approximately 500° C. to 2000° C., and furthermore, is also activated in the space 8.

The heated catalyzer 12 functions as a heat catalyzer for causing a current to flow to a medium and thus carrying out heating to a high temperature, thereby exciting and activating (decomposing) a contact gas. At least a surface of the heated catalyzer 12 is comprised of a metallic material. It is desirable that the metallic material should be comprised of a pure metal or an alloy material containing at least one of Ta, W, Re, Os, Ir, Nb, Mo, Ru and Pt which are high melting point metal materials. Moreover, the heated catalyzer 12 takes a shape obtained by deforming the metallic material into a wire shape, a plate shape or a mesh shape, for example. The heating means is not particularly restricted if it can heat a gas to a predetermined temperature. In the following description, the heated catalyzer 12 will be taken as an example.

Furthermore, the heated catalyzer 12 is preheated for a few minutes or more at a heating temperature in a film formation or more before the heated catalyzer 12 is used for forming a film. Consequently, in the film formation, it is possible to reduce doping of an impurity in the metallic material of the heated catalyzer 12 into the film.

Moreover, a dispersion board 14 is provided on an upstream side of the heated catalyzer 12 as shown in the drawing, so that it is possible to cause the gas to uniformly come in contact with the heated catalyzer 12, thereby activating the gas efficiently.

By the structure described above, it is possible to promote the decomposition of the first material gas by the heating of the heated catalyzer 12. Furthermore, the first material gas which is not decomposed or the first material gas recombined after the decomposition also has a temperature raised. Therefore, the gas decomposition is promoted in the space 8 more greatly. In addition, the second material gas is not caused to come in contact with the heated catalyzer 12 but is supplied from the second supply part 6 and is thus excited and activated in the space 8. Therefore, it is possible to form a thin film having a high quality at a high speed without an excessive decomposition of the second material gas.

In particular, a hydrogen gas (the first material gas) having a temperature raised by the heated catalyzer 12 is supplied to the space 8. Therefore, a reaction of higher-order silane formation is suppressed in the space 8 by a gas heating effect.

The reaction of higher-order silane formation indicates a reaction in which a high molecular weight polymer is generated by an $SiH_2$ insertion reaction, for example:

$$SiH_4 + SiH_2 \rightarrow Si_2H_6 \quad 1)$$

$$Si_2H_6 + SiH_2 \rightarrow Si_3H_8 \quad 2)$$

... the same $SiH_2$ insertion reaction continues ...

$SiH_2$ is generated together with $SiH_3$ to be a main component of a film formation through a collision of $SiH_4$ with an electron in a plasma. $SiH_2$ is generated in a larger amount with an increase in a plasma excitation power in order to particularly raise a film formation rate. As a result, $SiH_2$ is generated in a larger amount than a higher order silane molecule.

When the higher order silane molecule generated as described above sticks to a film formation surface, it disturbs a deposition reaction (a film growth reaction) on the film formation surface, resulting in a degradation in film quality, and also when the higher order silane molecule is taken into a film, moreover, it disturbs a film structure, resulting in a degradation in the film quality. It has already been known that the reaction of higher-order silane formation is an exothermic reaction. In other words, the reaction progresses by a discharge of a heat generated by the reaction to a space.

However, when the space to which the heat is to be discharged (more specifically, a space containing a hydrogen gas as a main component) has already been warmed by the gas heating effect, a reaction heat is discharged to the space with difficulty. In other words, the reaction of higher-order silane formation, i.e., a heat reaction, progresses with difficulty. Consequently, a silicon film having a high quality can be formed also under a high speed film formation condition in which a plasma excitation power is high.

Moreover, the first supply part 6a and the second supply part 6b may be arranged in various patterns, for example, a grid shaped pattern, a zigzag pattern and the like, respectively. In addition, the numbers of the first supply parts 6a and the second supply parts 6b may be different from each other. In the case in which a gas flow rate of the first material gas and a gas flow rate of the second material gas are different from each other, for example, the case in which the gas flow rate of the first material gas is higher than the gas flow rate of the second material gas, it is possible to maintain a supply balance and to form a deposited film having a uniform film thickness and film quality distribution by setting the number of the first supply parts 6a to be larger than the number of the second supply parts 6b.

Moreover, the first introducing path 3a and the second introducing path 3b may be directly connected to each cylinder, and furthermore, may be coupled to a gas regulating part for regulating a flow rate, a flow velocity and a temperature of a gas, and the like.

For the vacuum pump 9, it is desirable to use a dry system vacuum pump such as a turbo molecular pump in order to suppress a mixture of an impurity from an exhaust system into a film. An ultimate vacuum is set to be at least $1 \times 10^{-3}$ Pa or less, preferably, $1 \times 10^{-4}$ Pa or less and a pressure in the film formation which is varied depending on a type of a film to be formed, is set to be 50 Pa to 7000 Pa.

Figure 2:
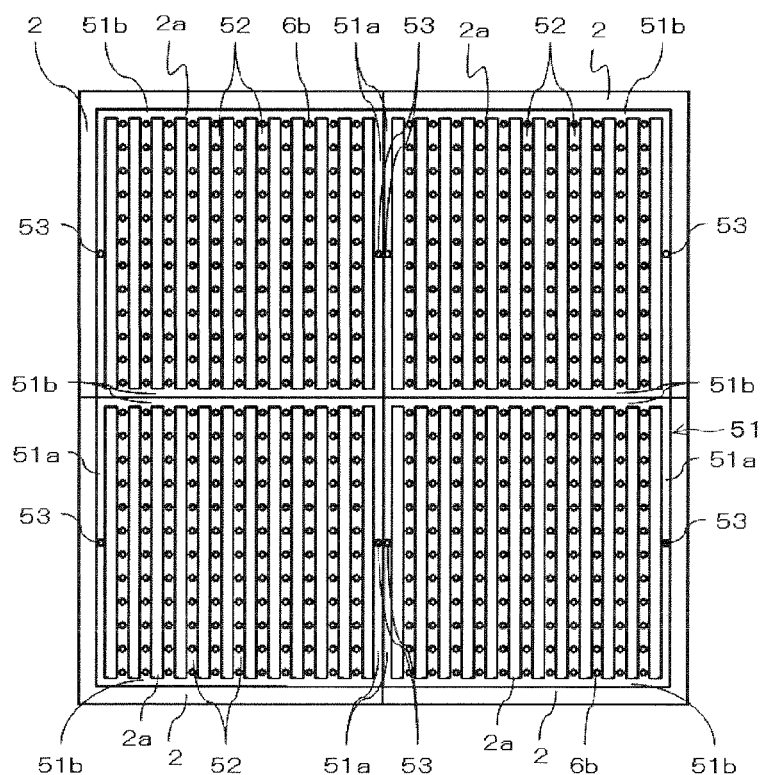
FIG. 2 is a sectional view taken along an A-A line of FIG. 1, typically illustrating a structure of a second supply path.

As shown in FIG. 2, the second electrode 2 includes a plurality of electrode plates 2a taking a rectangular and identical shape seen on a plane, for example (in this example, four electrode plates 2a taking an almost square shape seen on a plane are disposed symmetrically in a state in which they are adjacent to each other vertically and transversely as shown in the drawing); therefore, it is possible to prevent a deformation from being caused by a thermal expansion of the electrode plate 2a, and in a maintenance, it is possible to exchange only the electrode plate 2 which is deteriorated greatly. The electrode substrate 2b and the electrode plate 2a are coupled to each other with a bolt, a nut and the like with a gasket (not shown) interposed therebetween, so that the maintenance can easily be carried out. Therefore, it is possible to enhance a productivity through a shortage of a time required for the maintenance. Each electrode plate 2a is constituted by a main stream part 51 (comprised of a first main stream part 51a extended in a vertical direction shown in the drawing and a second main stream part 52b extended in a transverse direction shown in the drawing) which is provided around each electrode plate 2a, and a branch part 52 connected to the main stream part 51 and extended in a longitudinal direction, as the second supply path 5. In FIG. 2, the first supply path 4 and the first supply part 6a are omitted.

There is employed a structure in which the main stream part 51 is not provided with the second supply part 6b and only the branch part 52 is provided with the second supply part 6b. Moreover, in the main stream part 51 of the second supply path 5, a connecting port 53 to be a connecting portion to the second introducing path 3b formed on the electrode substrate 2b is provided in an adjacent portion of the electrode plates 2a, so that the second material gas can be directly supplied to the main stream part 51 positioned in the vicinity of a center of the apparatus.

Moreover, there is provided a flow rate control mechanism for controlling the flow rate of the second material gas to be introduced into the main stream part 51 through the second introducing path 3b, so that the second material gas can be supplied uniformly from the second introducing paths 3b, respectively. It is preferable that the flow rate control mechanism should regulate a conductance of the introducing path 3, and it is sufficient to regulate a sectional area of the introducing path 3 by means of a valve or a massflow meter. Moreover, the second introducing path 3b is also provided on both ends of the electrode plate, so that the second material gas can be supplied to the branch part 52 almost uniformly.

Furthermore, the first main stream part 51a to be connected to the second introducing path 3b and the second main stream part 51b to be connected to the branch part 52 cross each other almost perpendicularly, so that the second material gas can be supplied to the branch part 52 further uniformly.

Figure 3:
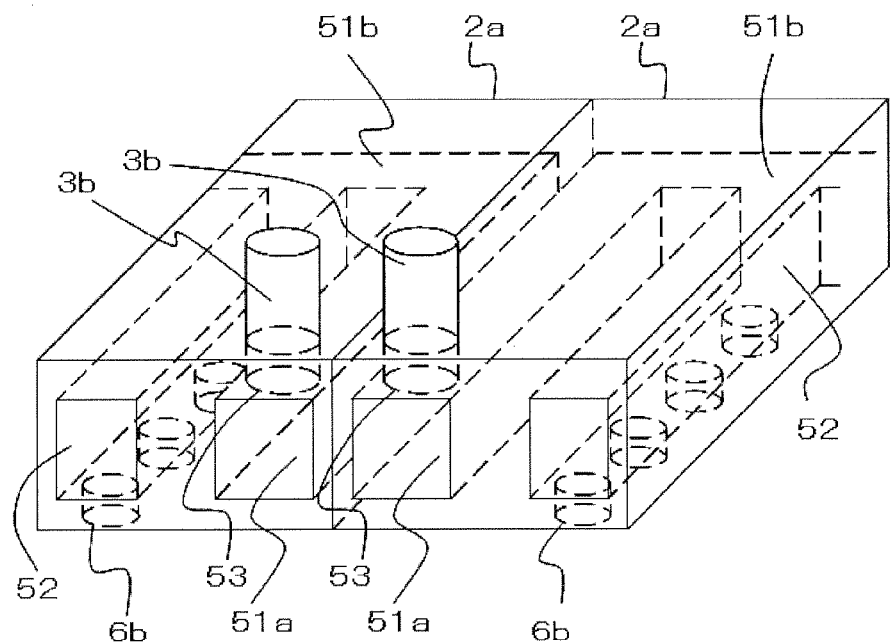
FIG. 3 is a partial perspective view for explaining a state in the vicinity of a connecting portion of a second introducing path and a main stream part in FIG. 2.

In FIG. 2, a plurality of connecting ports 53 of the second introducing path 3b and the first main stream part 51a is provided in the adjacent portion of the electrode plates 2a and the respective first main stream parts 51a are connected to the second main stream parts 51b provided on the electrode plates 2a to individually supply the second material gas to the branch parts 52 provided on the electrode plates 2a respectively as shown in an enlarged view of FIG. 3. By such a structure, the flow rate of the gas to be supplied to each of the electrode plates 2a can be controlled individually; therefore, it is possible to further expect that the second material gas is uniformly supplied. In FIG. 3, the first supply path 4 and the first supply part 6a are omitted.

It is sufficient that the connecting portion of the second introducing path 3b and the first main stream part 51a is provided in the adjacent portion of the electrode plates 2a which are adjacent to each other; therefore, the connecting port may be provided in only one place of the adjacent portion of the electrode plates 2a, for example.

As described above, in the apparatus for forming deposited film Si, the second electrode 2 comprises the electrode substrate 2b and the electrode plates 2a disposed on the electrode substrate 2b. Moreover, the electrode plate 2a comprises the first supply part 6a for supplying the first material gas to the space 8 between the first electrode 7 and the second electrode 2, the second supply part 6b for supplying the second material gas to the space 8, the first supply path 4 which is connected to the first supply part 6a and into which the first material gas is to be introduced, and the second supply path 5 which is connected to the second supply part 6b and into which the second material gas is to be introduced. The electrode substrate 2b comprises the heating means (the heated catalyzer 12) for heating the first material gas, the first introducing path 3a for introducing the first material gas to the first supply path 4, and the second introducing path 3b for introducing the second material gas to the second supply path 5. The second supply path 5 comprises the main stream part 51 into which the second material gas is to be introduced from the second introducing path 3b and which is not provided with the second supply part 6b, and the branch parts 52 into which the second material gas is to be introduced from the main stream part 51 and which is provided with the second supply part 6b. The connecting portion (the connecting port 53) of the second introducing path 3b and the main stream part 51 is positioned in the adjacent portion of the electrode plates 2a which are adjacent to each other.

By the structure described above, it is possible to uniformly supply a material gas having a low flow rate from each supply part into the chamber 1 while suppressing a deformation of the electrode plate 2a due to a thermal expansion. Consequently, it is possible to form, on the substrate 10, a deposited film which has a uniform film thickness distribution and is excellent.

Figure 4:
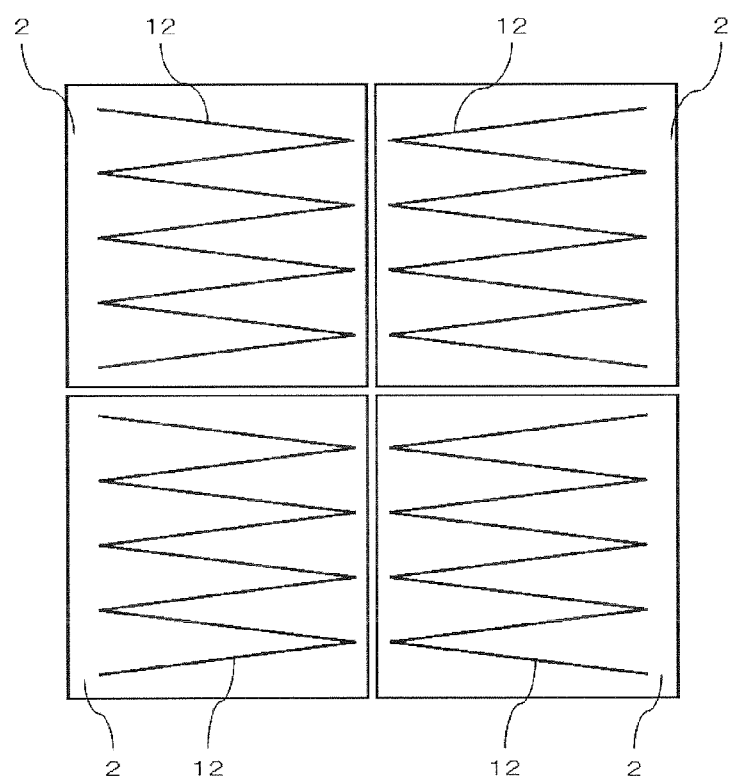
FIG. 4 is a schematic sectional view showing an embodiment of a heated catalyzer to be used in the apparatus for forming deposited film according to the present invention.
Figure 5:
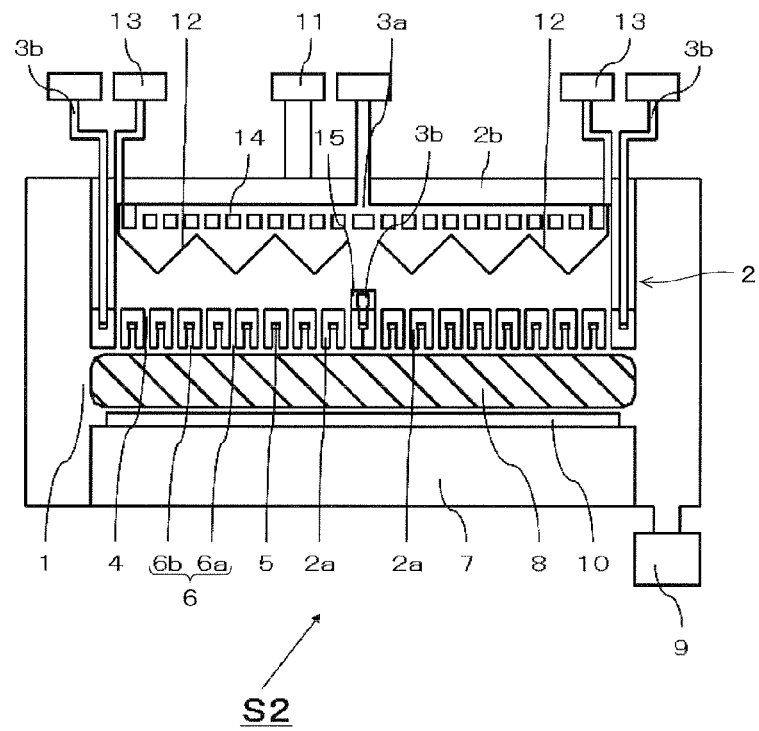
FIG. 5 is a schematic sectional view showing an embodiment of the apparatus for forming deposited film according to the present invention.

Moreover, as shown in FIG. 5, a plurality of heated catalyzers 12 is provided in an apparatus for forming deposited film S2, so that it is possible to decrease an installation area per unit (region) in a place in which the heated catalyzers are to be provided. Therefore, it is possible to lessen an amount of extension of the heated catalyzer 12 due to a thermal expansion in heating, and thus, it is possible to reduce a problem in that the heated catalyzer 12 comes in contact with a side wall in a space in which the heated catalyzer 12 is to be installed. Moreover, as shown in FIG. 4, the heated catalyzer 12 is provided to make a pair with each electrode plate 2a; and accordingly, in the case in which the electrode plate 2a is removed to carry out a maintenance over an optional one of the heated catalyzers 12, it is sufficient to remove only the electrode plate 2a corresponding to the heated catalyzer 12. Thus, it is possible to shorten a time required for the maintenance.

Furthermore, by providing a plurality of first introducing paths 3a, it is possible to reduce a variation in an amount of the first material gas to be supplied from each first supply part 6a which is caused by an increase in the area of the apparatus. Furthermore, it is possible to efficiently supply the first material gas to the heated catalyzers 12 provided in the respective first introducing paths 3a. In this case, the number of the first introducing paths 3a may be smaller than that of the electrode plates 2a or may be equal to that of the electrode plates 2a. Thus, it is easy to control the first material gas to be supplied from each electrode plate 2a. Furthermore, by setting the first introducing path 3a and the heated catalyzer 12 to make pairs with the respective electrode plates 2a, it is possible to individually control the gas flow rate and the temperature of the heated catalyzer 12 in each of the respective electrode plates 2a, so that it is possible to obtain an excellent film characteristic distribution.

As in the apparatus for forming deposited film S2 shown in FIG. 5, a bar shaped reinforcing rib 15 supported on the second electrode 2 may be provided on a central portion in the apparatus for forming deposited film S2, and each electrode plate 2a may be thus fixed to the reinforcing rib 15. By the structure described above, the multiple electrode plates 2a can be attached to one first introducing path 3a. Furthermore, the second introducing path 3b may be provided in the reinforcing rib 15. Consequently, the second material gas can be supplied from the vicinity of the central portion of the apparatus for forming deposited film S2 to the main stream part 51, and can be supplied to the branch part 52 of each electrode plate 2a almost uniformly.

Moreover, a plurality of heated catalyzers 12 are provided in one first introducing path 3a, so that the first material gas can be caused to efficiently come in contact with the heated catalyzer 12. Moreover, it is possible to regulate the heating temperatures of the respective heated catalyzers 12. Consequently, the temperature of the heated catalyzer tends to be dropped in an outer peripheral portion of the first introducing path 3a due to a heat exchange with a side wall of a heated catalyst space, for example; therefore, by setting the temperature of the heated catalyzer 12 provided in the outer peripheral portion to be higher, it is possible to carry out soaking, thereby enabling uniform heating of the first material gas in the first introducing path.

Figure 6:
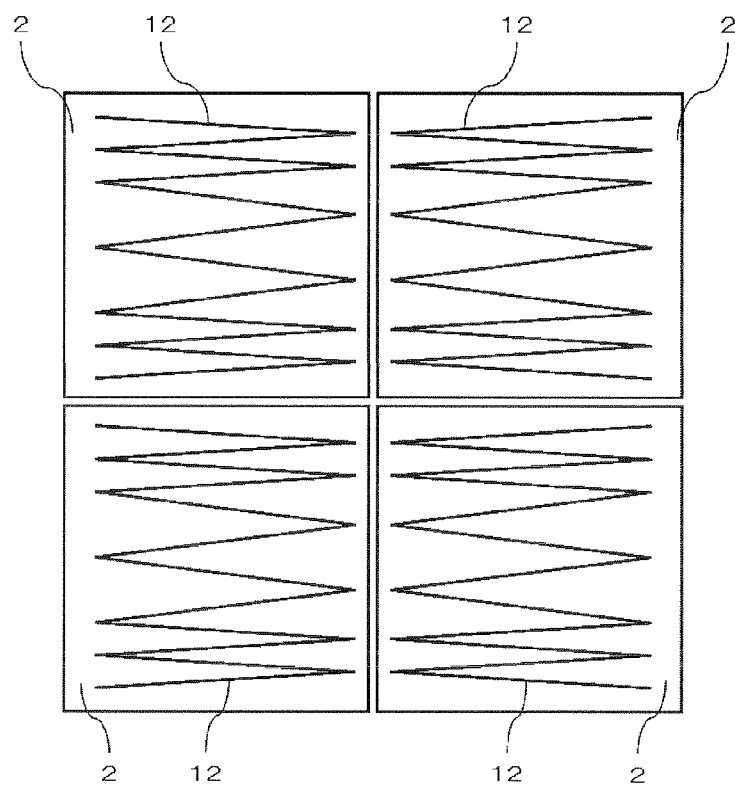
FIG. 6 is a schematic sectional view showing an embodiment of the heated catalyzer to be used in the apparatus for forming deposited film according to the present invention.

In addition, in the case in which the heated catalyzer 12 is comprised of a metal wire, it is disposed to be extended in a wavy form from one of ends of the electrode plate 2a toward the other end in order to overlap with the electrode plate 2a when viewed through in plan view from the electrode plate 2a side, and a density of the metal wire (an area occupied by the metal wire in the electrode plate 2a having an overlap with the metal wire) may be varied properly. For example, as shown in FIG. 6, the outer peripheral portion of the first introducing path 3a easily cools down; therefore, by setting an end side of the first introducing path 3a to be occupied by the metal wire more densely than a central portion of the first introducing path 3a (that is, by disposing the metal wire on the electrode substrate 2b in such a manner that the area occupied by the metal wire in the electrode plate 2a is reduced in the central part of the electrode plate 2a when viewed through in plan view), therefore, it is possible to uniformly heat the first material gas in the first introducing path 3a. Moreover, the metal wire is not set into the wavy form but a plurality of straight metal wires may be arranged in parallel.

Furthermore, by increasing a reflectance on a side of the first introducing path 3a which faces the heated catalyzer 12, it is possible to produce an effect for suppressing a rise in the temperature of the second electrode 2 and a reduction in the temperature of the heated catalyzer. As a method, specular working for a reflecting surface or a processing for forming deposited film of Ag, Al, Au or the like is carried out in order to obtain a reflectance of 80% or more, preferably 90% or more, for example.

Figure 7:
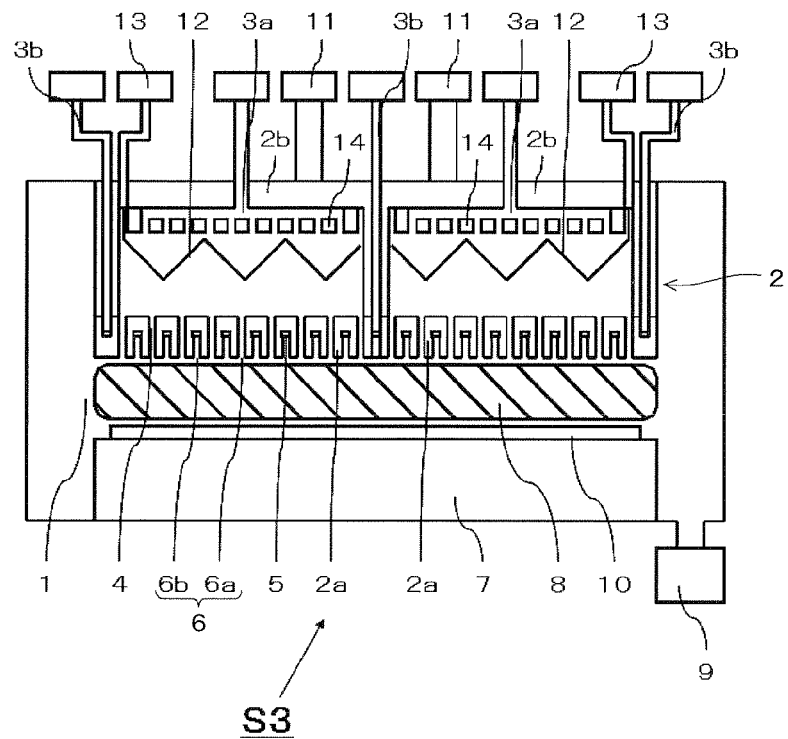
FIG. 7 is a schematic sectional view showing an embodiment of the apparatus for forming deposited film according to the present invention.

Furthermore, although FIG. 2 shows the example in which the respective electrode plates 2a are electrically connected to each other and a power is applied from the single high-frequency power source 11 to the electrode plates 2a, the high-frequency power source 11 may be provided corresponding to each of the second electrodes 2 to insulate the second electrodes 2 from each other as in an apparatus for forming deposited film S3 shown in FIG. 7. According to the apparatus for forming deposited film S3, it is possible to finely regulate a high frequency power and a phase which are applied from each of the high frequency power sources 11 to each of the second electrodes 2. Consequently, it is possible to form a deposited film in a uniform film quality and film thickness on the substrate 10.

Figure 8:
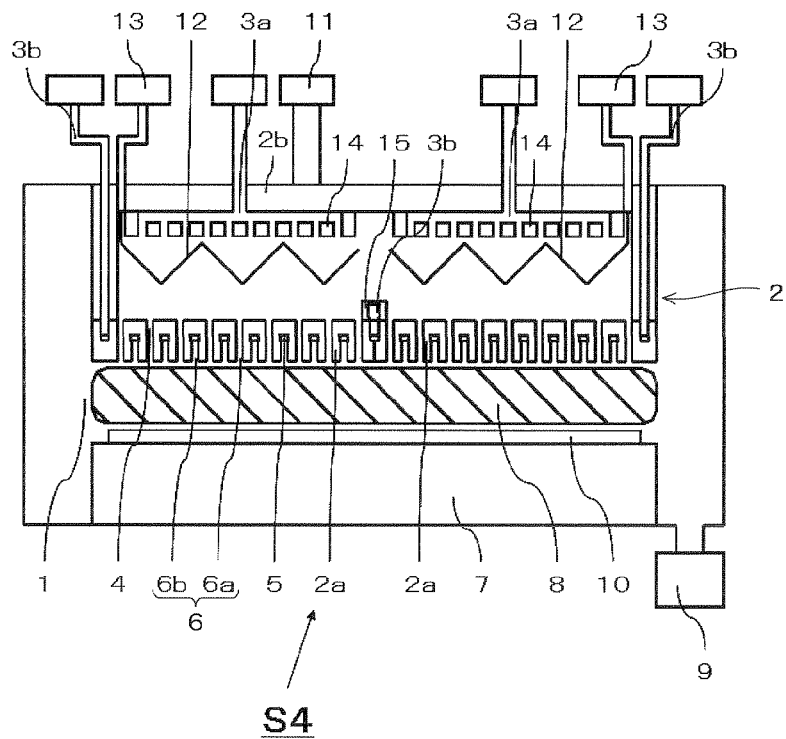
FIG. 8 is a schematic sectional view showing an embodiment of the apparatus for forming deposited film according to the present invention.

Moreover, as in an apparatus for forming deposited film S4 shown in FIG. 8, the first introducing paths 3a may be collected into a single space in which the heated catalyzer 12 is present, and the electrode plates 2a may be thus attached. In this case, it is preferable that the heated catalyzers 12 should be provided to make pairs with the electrode plates 2a. By the apparatus for forming deposited film S4, it is possible to expect that the first material gas in the first introducing path 3 is heated uniformly.

As in an apparatus for forming deposited film S5 shown in FIG. 9, moreover, the electrode substrate 2b may comprise a cooling mechanism 16 for cooling the electrode substrate 2b and/or the electrode plate 2a. For example, the cooling mechanism 16 for cooling the second electrode 2 may be provided in the vicinity of the first supply path 4 and the second supply path 5 in the electrode substrate 2b. As the cooling mechanism 16, it is possible to use a refrigerant path through which a cooling medium flows or a heat pipe.

By the structure described above, it is possible to suppress a rise in the temperature of the second electrode 2; therefore, a rise in a surface temperature of the substrate 10 is suppressed. As a result, it is possible to form a deposited film having an excellent film quality. In addition, an in-plane temperature distribution of the electrode plate 2a can be made uniform, so that an in-plane temperature distribution of the substrate 10 can be improved, and furthermore, an in-plane temperature distribution of the material gas supplied from the electrode plate 2a can be improved. Therefore, it is possible to uniformly form the deposited film having the excellent film quality. Moreover, a deformation is caused by the rise in the temperature of the electrode plate 2a with difficulty. Therefore, it is possible to obtain an excellent film characteristic distribution, and it is possible to prolong a maintenance cycle of the apparatus. Accordingly, it is possible to lead to heightening of productivity. By providing the cooling mechanisms 16 to make the pairs with the respective second electrodes 2, it is possible to finely regulate the temperature of the second electrode 2. Consequently, it is possible to form the deposited film in the uniform film quality and film thickness on the substrate 10.

Furthermore, the cooling mechanism may be provided in a portion other than the second introducing path 3b between the plurality of first introducing paths 3a. Consequently, a deformation is caused by a rise in the temperature of the electrode substrate 2b with difficulty and a decrease in a mechanical strength can be reduced, so that it is possible to expect that the maintenance cycle of the apparatus is prolonged to lead to heightening of the productivity.

Moreover, it is also possible to provide a reflecting plate 17 for reflecting a radiation heat of an infrared wavelength to be applied from the heated catalyzer 11 and to cause the cooling mechanism 16 to have a function of the reflecting plate. By the structure described above, it is possible to further have an effect for suppressing a rise in the temperature of the second electrode 2 and a reduction in the temperature of the heated catalyzer. As a method, specular working for a reflecting surface or a processing for forming deposited film of Ag, Al, Au or the like is carried out in order to obtain a reflectance of 80% or more, preferably 90% or more, for example. A plurality of reflecting plates 17 may be provided to make pairs with the respective electrode plates 2a and a maintenance can be enhanced.

Figure 10A:
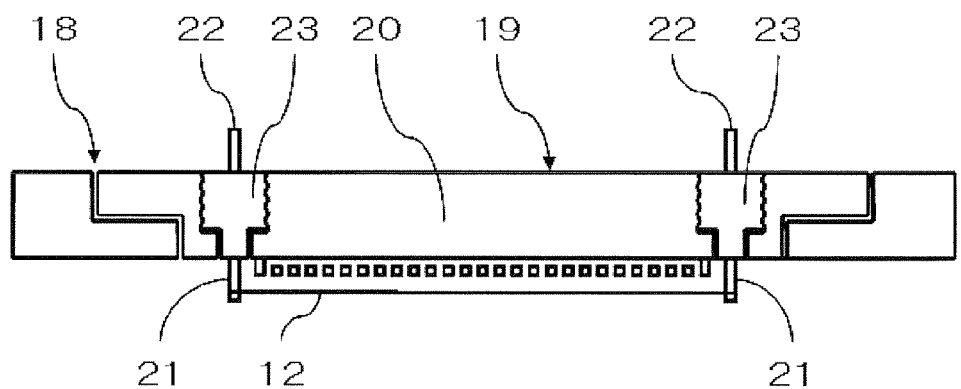
FIG. 10A is a schematic sectional view showing an embodiment of a heated catalyzer exchanging unit of the apparatus for forming deposited film according to the present invention and FIG. 10B is a plan view showing the embodiment of the heated catalyzer exchanging unit.
Figure 10B:
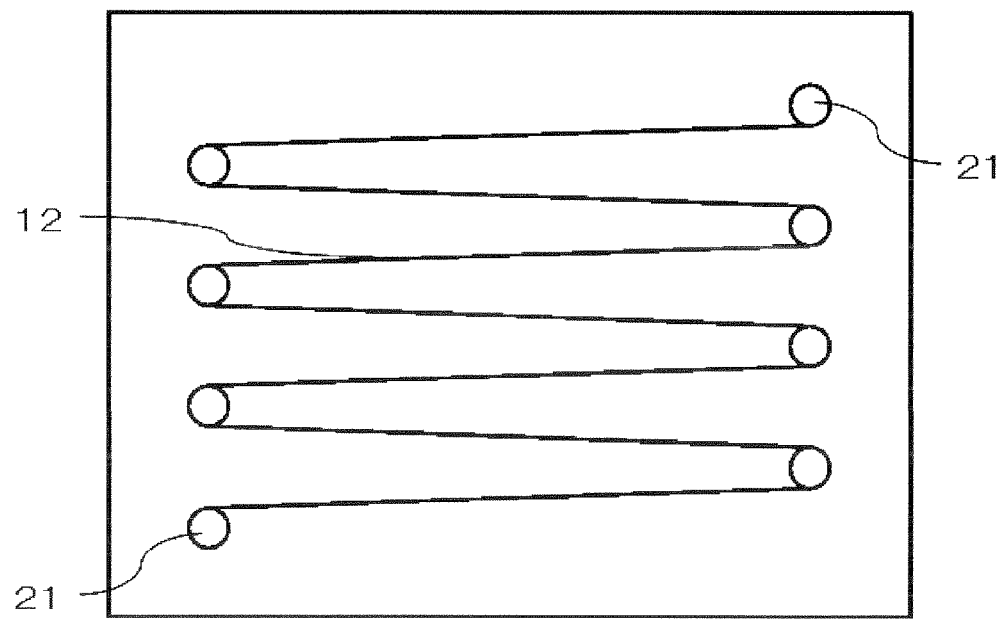

Moreover, as shown in FIGS. 10A and 10B, an outer peripheral portion of the apparatus for forming deposited film comprises a communicating part 18 capable of communicating with an outside, and a heated catalyzer exchanging unit 19 provided with the heated catalyzer 12 may be attached to the communicating part 18 so as to be freely fitted from the outside. A shape and a size of an opening portion of the communicating part 18 are properly designed depending on a size and a shape of the heated catalyzer exchanging unit 19 in such a manner that a vacuum in a film forming chamber can be held. An internal wall of the communicating part 18 may take a shape of a taper with an inclination angle of approximately 1 to 5°. By such a structure, the heated catalyzer exchanging unit 19 provided with the heated catalyzer 12 is constituted to be removable from the outside of the apparatus; therefore, it is possible to minimize a time required for a work for exchanging the heated catalyzer, thereby carrying out an efficient production. Furthermore, as compared with the conventional apparatus, an amount of moisture sticking due to the air entering a thin film forming chamber is reduced more greatly, so that it is possible to shorten a time required for vacuum bake to be carried out when starting a film forming process after the exchange of the heated catalyzer. Differently from the conventional heated catalyzer exchanging work, furthermore, a shower head (a shower electrode) does not need to be removed; therefore, it is possible to prevent a variation in a film quality from being caused by a positional shift of the shower head after the exchange of the heated catalyzer or the like.

The heated catalyzer exchanging unit 19 is constituted in order to provide the heated catalyzer 12 to be electrically conducted and to easily take the heated catalyzer 12 provided in the apparatus to the outside of the apparatus.

It is sufficient that a unit substrate 20 has such a shape as to be fitted in the opening portion of the communicating part 18 formed in the apparatus and the shape is not particularly restricted. For example, a planer shape may be a rectangle, a circle, an ellipse or the like. For the unit substrate 20, a metal such as stainless steel is used. In order to cause the fitting into the opening portion of the communicating part 18 to be stronger, it is preferable that an O ring or the like should be disposed in an outer peripheral portion of the unit substrate 20 and a fitting portion of the outer peripheral portion should comprise a step structure. Moreover, the unit substrate 20 has a high temperature in a film formation, so that in order to carry out cooling in a removal, it is preferable to provide a cooling mechanism in the unit substrate 20.

A plurality of supports 21 is erected on the unit substrate 20, and the heated catalyzer 12 is properly provided between these supports 21. The heated catalyzer 12 is provided to reciprocate between the supports 21 erected on the unit substrate 20. It is preferable that a groove or the like should be formed on a tip portion of the support 21 in order to easily dispose the heated catalyzer 12. Although a disposing method is not particularly restricted, it is preferable that the heated catalyzer 12 should be wound upon the groove on the tip portion of the support 21 to make a round or more in consideration of a thermal expansion of the heated catalyzer 12 in heating, for example.

The support 21 positioned on an end comprises an electric conducting part 22 for electrically conducting the heated catalyzer 12. An electric conductor is present to penetrate an inner portion of the support 21, and a screw structure of the electric conductor is formed on a tip portion of the support 21 so as to be exposed. The heated catalyzer 12 is connected to the electric conductor. For the electric conducting part 22, it is preferable to use a metallic material having a heat resisting temperature of approximately 800° C. in a vacuum, and a nickel base alloy or the like is used, for example. In order to ensure an insulation property from an electric power applied from a high frequency power source connected to a plasma generating electrode (a shower head), it is preferable to comprise such a structure that the electric conducting part 22 and the unit substrate 20 do not come in electric contact with each other, and an insulating member 23 is disposed around the electric conductor and on a portion which can come in contact with the electric conductor in the unit substrate 20. For the insulating member 23, for example, alumina, quartz or the like is used.

The heated catalyzer exchanging unit 19 is removably fitted in the opening portion of the communicating part 18. The number of the heated catalyzer exchanging units 19 to be fitted is not particularly restricted. Although the number may be one or more, it is preferable that the heated catalyzer exchanging unit 19 should be provided to make a pair with the electrode plate 2a because an individual control can be carried out. Moreover, in order to cause the fitting to be stronger, an attachment is carried out with a fixing screw or the like.

<Method of Forming Deposited Film>

Description will be given to a method of forming a deposited film according to the present embodiment. In order to form the deposited film, the method comprises a step of causing the first electrode 7 to hold the substrate 10, a step of applying a high frequency power to the second electrode 2, a step of supplying the first material gas activated by the heated catalyzer 12 from the first supply part 6a and supplying the second material gas from the second supply part 6b toward the substrate 10, thereby activating the second material gas in the space 8 generated between the first electrode 7 and the second electrode 2. By these steps, the first material gas which is activated and the second material gas are mixed with each other in the space 8 and components in the material gases are deposited on the substrate 10 so that a deposited film is formed on the substrate 10.

At the steps described above, the substrate 10 is delivered by means of a substrate delivering mechanism or the like (not shown), and is held on the first electrode 7. Then, the substrate 10 is fixed onto the first electrode 7.

The first material gas is heated by the heated catalyzer 12 in the first introducing path 3a and is supplied from only the first supply part 6a so that the first material gas having a temperature raised by the heated catalyzer 12 is supplied to the space 8. Therefore, a reaction of higher-order silane formation in the space 8 is suppressed by a gas heating effect.

Moreover, in the case in which a hydrogenated amorphous silicon film is formed, an $H_2$ gas is supplied to the first introducing path 3a and an $SiH_4$ gas is supplied to the second supply path 5. Furthermore, it is sufficient to set a gas pressure to be equal to or higher than 50 Pa and to be equal to or lower than 700 Pa, to set a gas flow ratio of $H_2/SiH_4$ to be equal to or higher than 2/1 and to be equal to or lower than 40/1, and to set a high frequency power density to be equal to or higher than 0.02 W/cm$^2$ and to be equal to or lower than 2 W/cm$^2$. In a pin junction thin film solar cell including an i-type amorphous silicon film, it is sufficient to set a film thickness of the i type amorphous silicon film to be equal to or greater than 0.1 μm and to be equal to or smaller than 0.5 μm, and preferably, to be equal to or greater than 0.15 μm and to be equal to or smaller than 0.3 μm.

Moreover, in the case in which a hydrogenated microcrystalline silicon film is formed, an $H_2$ gas is supplied to the first introducing path 3a and an $SiH_4$ gas is supplied to the second supply path 5. Moreover, it is sufficient to set a gas pressure to be equal to or higher than 100 Pa and to be equal to or lower than 7000 Pa, to set a gas flow ratio of $H_2/SiH_4$ to be equal to or higher than 10/1 and to be equal to or lower than 200/1, and to set a high frequency power density to be equal to or higher than 0.1 W/cm$^2$ and to be equal to or lower than 1 W/cm$^2$. In a pin junction thin film solar cell including an i-type microcrystalline silicon film, it is sufficient to carry out the formation in a film thickness of the i type microcrystalline silicon film so that the film thickness is to be equal to or greater than 1 μm and to be equal to or smaller than 4 μm, and preferably, to be equal to or greater than 1.5 μm and to be equal to or smaller than 3 μm, and a crystallization ratio is approximately 70%.

In the forming method according to the present embodiment, the hydrogen gas (the first material gas) having the temperature raised by the heated catalyzer 12 is supplied to the space 8. Therefore, the reaction of higher-order silane formation in the space 8 is suppressed by a gas heating effect so that a crystallization of the microcrystalline silicon film can be promoted; thus, the film can be formed at a high speed.

As compared with the hydrogenated amorphous silicon film, the flow rate of the $SiH_4$ gas is much lower than that of the $H_2$ gas in the formation of the hydrogenated microcrystalline silicon film. For this reason, since a gas pressure is not balanced between the first and second supply parts 6 so that the $SiH_4$ gas is uniformly supplied from each of the second supply parts 6b with difficulty, there is a possibility that a film thickness distribution might be ununiform; however, by depositing a film using the apparatus for forming deposited film, it is possible to reduce the possibility. In addition, by setting the number of the second supply parts 6b to be smaller than that of the first supply part 6a or decreasing an opening sectional area of the second supply part 6b, it is possible to increase a gas pressure in the second supply path 5, thereby jetting the $SiH_4$ gas from the second supply parts 6b uniformly. Furthermore, by dividing and supplying a part of the $H_2$ gas (the first material gas) supplied to the first introducing path 3a into the second introducing path 3b, it is possible to increase a total flow rate of the gas supplied from the second supply part 6b. Consequently, a gas pressure (a total pressure) in the second supply path 5 is increased, and thus, it is possible to uniformly jet the $SiH_4$ gas from the second supply parts 6b.

<Thin Film Forming Method Including Cleaning Method>

Next, an example of a thin film forming method including a cleaning method to be carried out before the above-mentioned formation of the thin film will be described by taking the apparatus for forming deposited film S1 as an example.

Before forming a thin film by a plasma generated between the first electrode 7 and the second electrode 2, it is preferable to sequentially carry out the following steps 1, 2 and 3.

Step 1: A step of supplying a carrier gas from the first supply part 6a into the chamber 1 and then supplying a cleaning gas including a gas containing fluorine in a molecular formula and/or a gas containing chlorine in a molecular formula from the second supply part 6b into the chamber 1.

Step 2: A step of activating the cleaning gas by the plasma generated between the first electrode 7 and the second electrode 2.

Step 3: A step of stopping the supply of the cleaning gas and heating heating means.

More specifically, the method comprises a step of applying a high frequency power to the second electrode 2, the step 1 of supplying a carrier gas containing at least a hydrogen gas or an inactive gas from the first supply part 6a into the chamber 1 via the first introducing path 3a including the heated catalyzer 12 and supplying a cleaning gas containing at least a gas containing F (fluorine) in a molecular formula or Cl (chlorine) in a molecular formula from the second supply part 6b into the chamber 1, a dry cleaning step of the step 2 of activating the cleaning gas in the space 8 in which a plasma is generated between the first electrode 7 and the second electrode 2, and furthermore, a heating step of the step 3 of stopping the supply of the cleaning gas and heating the heating means provided in the apparatus for forming deposited film S1 after the dry cleaning step.

At the dry cleaning step, it is possible to use a gas such as $N_2$, Ar, He or the like as the inactive gas to be utilized for the carrier gas. Moreover, it is possible to use a gas such as $F_2$, $CHF_3$, $SF_6$, $NF_3$, $CF_4$, $C_2F_6$, $C_3H_8$, $C_5F_8$, $ClF_3$ or $C_2ClF_5$ for the cleaning gas containing fluorine, and it is possible to use a gas such as $Cl_2$, $CCl_4$, $ClF_3$ or $C_2ClF_5$ for a cleaning gas containing chlorine.

These cleaning gases are excited and activated in the space 8. Consequently, when a semiconductor film such as an amorphous silicon film is formed, a deposit, for example, a silicon film, powder or the like which is deposited on a structural member in the chamber 1 reacts with the activated cleaning gas so that the deposit vaporizes and is thus exhausted by means of the vacuum pump 9.

Moreover, by supplying the carrier gas from the first supply part 6a and supplying the cleaning gas from the second supply part 6b, it is possible to reduce a contact of the heated catalyzer 12 and the cleaning gas and to carry out cleaning in the chamber 1 while decreasing a deterioration in a corrosion of the heated catalyzer 12.

It is sufficient that a density of a high frequency power to be applied to the second electrode 2 in the cleaning should be set to be equal to or higher than 0.1 $W/cm^2$ and be equal to or lower than 3 $W/cm^2$.

Next, in order to remove the cleaning gas remaining in the chamber 1, the supply of the cleaning gas is stopped and an inner part of the chamber 1 is evacuated by means of the vacuum pump 9, and the heating means provided in the first introducing path 3a is then heated to raise a temperature of the structural member in the chamber 1. Although the heating means may be provided separately in the chamber 1 or on an external wall of the chamber 1, the heated catalyzer 12 provided in the first introducing path 3a is used in both of the formation of the thin film and the heating step so that the heating means does not need to be always provided separately. Accordingly, a prevention of a characteristic from being deteriorated after the cleaning by the present method does not particularly increase an apparatus cost. Description will be given by taking, as an example, the case in which the heating means comprised of the heated catalyzer 12 is used as the heating means.

The structural member in the chamber 1 is heated by means of the heated catalyzer 12 by raising the temperature of the heated catalyzer 12 to be equal to or higher than 300° C. and to be equal to or lower than 2000° C. By raising the temperature of the structural member in the chamber 1, it is possible to positively eliminate a cleaning residual gas which cannot be completely removed by an evacuation or a plasma treatment from the structural member in the chamber 1. The inner part of the chamber 1 is evacuated during and after the heating so that the residual gas is discharged from the inner part of the chamber 1. Consequently, since it is possible to reduce a residual percentage of the cleaning gas in the chamber 1, it is possible to reduce a mixture of a cleaning gas component in a formation of a semiconductor film of a solar cell element. Referring to the solar cell element formed after the cleaning, similarly, since it is possible to increase an output, it is possible to form a solar cell element having continuously stable output characteristics.

In the case in which the solar cell element is formed by the apparatus for forming deposited film having the heating means, the heated catalyzer 12 and the plasma are used together to form a thin film; therefore, the temperature of the structural member in the chamber is raised by the heat of the heated catalyzer 12 during the formation of the thin film, so that the cleaning gas remaining in the member is eliminated easily. Therefore, the cleaning gas residual component mixes into the solar cell element, resulting in a deterioration in a characteristic. However, by the thin film forming method, the residual percentage of the cleaning gas in the chamber 1 can be decreased more greatly, so that it is possible to form a solar cell element having stable output characteristics.

Moreover, by carrying out heating while supplying one of a hydrogen gas, an inactive gas and a thin film forming gas or a mixed gas thereof at the heating step, it is possible to push the eliminated cleaning gas out of the chamber 1 before it sticks to the structural member in the chamber 1 again. Therefore, it is possible to decrease the residual percentage of the cleaning gas in the apparatus more greatly. In particular, the cleaning gas is introduced at the cleaning step in the second introducing path 3b; therefore, the residual amount of the cleaning gas is large. However, when the gas is supplied to the second introducing path 3b, an effect of a push out of the introducing path through the gas is applied to the elimination of the cleaning gas residual component by the heating, and thus, it is possible to decrease the residual percentage of the cleaning gas in the second introducing path 3b more greatly. In addition, by supplying the gas from the first introducing path 3a, it is possible to prevent the eliminated cleaning gas from reversely flowing into the first introducing path 3a, thereby reducing a deterioration in the heated catalyzer 12 with a contact with the cleaning gas. Furthermore, in the case in which the gas is not supplied into the chamber 1, a rise in the temperature of the structural member in the chamber 1 is carried out by a radiation from the heated catalyzer 12. For this reason, a heating efficiency of the structural member in the chamber 1 is low; thus, a removing efficiency of the cleaning gas is reduced. Accordingly in order to increase the removing efficiency of the cleaning gas, it is necessary to raise the temperature of the heated catalyzer 12 up to a high temperature of approximately 2000° C. However, in the case in which the gas is supplied, a thermal conduction is applied by the gas; therefore, it is possible to increase the removing efficiency of the cleaning gas while dropping the temperature of the heated catalyzer 12 which is required for raising the temperature of the structural member in the chamber 1. Consequently, a lifetime of the heated catalyzer 12 can be enhanced and a productivity can be improved.

At the heating step accompanied by the supply of the gas, it is sufficient to determine an in-chamber pressure and a gas flow rate in such a manner that a gas residence time t (second) defined by the following equation is set to be equal to or less than 30 seconds, preferably, to be equal to or less than 15 seconds.

$$\tau = P \times V/Q$$

wherein P represents an in-chamber pressure (Pa), V represents an in-chamber space volume ($m^3$), and Q represents a gas supply amount (Pa·$m^3$/sec). For example, the in-chamber pressure is set to be approximately 50 Pa to 300 Pa.

Moreover, it is preferable that a high frequency power should be applied to the second electrode 2 and the heating step should be thus carried out with a glow discharge generated between the first electrode 7 and the second electrode 2. In particular, the cleaning gas which is easily eliminated from the member of the apparatus and the activated hydrogen react with each other through a hydrogen plasma generated by supplying a hydrogen gas, and thus, it is possible to remove the cleaning gas from the inner part of the apparatus more efficiently. Furthermore, by supplying the hydrogen gas through the first introducing path 3a and heating the heated catalyzer 12, it is possible to further promote the elimination of the cleaning gas by the hydrogen gas having a temperature raised. By supplying a thin film forming gas to add a preliminary film formation, such as, supplying the first material gas from the first introducing path 3a and supplying the second material gas from the second introducing path 3b, it is possible to take a component of the cleaning gas which cannot be completely removed from the inner part of the chamber by the exhaust through the vacuum pump 9 into a film formed on the structural member in the chamber 1 through the preliminary film formation, thereby reducing an influence of a cleaning gas component in the formation of the solar cell element. Moreover, a substrate is disposed in the preliminary film formation so that a film having the cleaning gas component taken therein is formed on the substrate and the substrate is then taken out of the chamber 1; thus, it is possible to reduce the residual percentage of the cleaning gas in the chamber 1 more greatly. If the residual percentage of the cleaning gas in the chamber 1 is high, it is impossible to sufficiently remove the cleaning gas by simply carrying out the preliminary film formation; therefore, by carrying out the heating step accompanied by the film formation after executing the heating step accompanied by the hydrogen plasma, it is possible to remove the cleaning gas from the inner part of the apparatus more efficiently.

Moreover, by carrying out the heating step plural times, it is possible to further reduce the residual percentage of the cleaning gas in the apparatus. In addition, by stopping the supply gas at the heating step carried out plural times and once evacuating the inner part of the chamber 1 by means of the vacuum pump 9, it is possible to reduce a reattaching of the removed cleaning gas to the structural member in the chamber.

Furthermore, by heating the heating means to carry out the cleaning step, it is possible to remove the sticking film while reducing the cleaning gas sticking to the component in the chamber 1; therefore, it is possible to decrease the residual percentage of the cleaning gas after the cleaning step and to shorten a time required for the heating step to be subsequently executed, thereby enhancing a productivity.

EXAMPLE

By supplying an Ar gas (a carrier gas) and an $NF_3$ gas (a cleaning gas) into the chamber from the first supply part and the second supply part using the apparatus for forming deposited film shown in FIG. 1, respectively, the thin film forming apparatus was cleaned.

In an example 1, a hydrogen gas was supplied from the first supply part and the second supply part into the chamber while the heated catalyzer was heated to 1500° C. after the cleaning step, and a high frequency power was applied to the second electrode to carry out a hydrogen plasma treatment for 20 minutes.

Moreover, in an example 2, the hydrogen gas was supplied from the first supply part and the second supply part into the chamber while the heated catalyzer was heated to 1500° C. in the same manner as in the example 1, a high frequency power was applied to the second electrode to carry out the hydrogen plasma treatment for 20 minutes, the heating of the heated catalyzer was stopped, and the inner part of the apparatus was evacuated, and a glass substrate was then provided in the apparatus, and the hydrogen gas and a silane gas were supplied from the first supply part and the second supply part respectively so that a microcrystalline silicon film having a thickness of 1 μm was preliminarily formed on the glass substrate.

As a comparative example, moreover, the heated catalyzer was not heated but the hydrogen gas was supplied from the first supply part and the second supply part into the chamber, and a high frequency power was applied to the second electrode to carry out the hydrogen plasma treatment for 20 minutes, and the inner part of the apparatus was evaluated and the glass substrate was then disposed in the apparatus, and the hydrogen gas and the silane gas were supplied from the first supply part and the second supply part respectively so that a microcrystalline silicon film having a thickness of 1 μm was preliminarily formed on the glass substrate.

Next, a glass substrate where a transparent conductive film comprised of $SiO_2$ is formed on a surface is disposed in the apparatus. In the example 2 and the comparative example, the glass substrate subjected to the preliminary film formation is taken out and the glass substrate having the transparent conductive film formed thereon is provided. In order from the glass substrate side, p-type hydrogenated amorphous silicon, i-type hydrogenated amorphous silicon, n-type hydrogenated amorphous silicon, p-type hydrogenated microcrystalline silicon, i-type hydrogenated microcrystalline silicon, and n-type hydrogenated amorphous silicon were formed in films. In only the formation of the i-type hydrogenated microcrystalline silicon film, the heated catalyzer was heated to 1500° C. and the heated catalyzer was not heated in the formation of the other films. Then, a transparent conductive film comprised of ITO and a metal electrode comprised of silver were formed on the n type hydrogenated amorphous silicon by sputtering so that a solar cell element was fabricated. Subsequently, the solar cell element was fabricated continuously two more times.

Output characteristics (a conversion efficiency and a fill factor) of the solar cell element fabricated after the cleaning method on each condition were measured by a simulator. In this case, as measuring conditions, there were set a surface temperature of the solar cell element: 25° C., a relative spectral distribution: AM 1.5 global solar radiation standard sunlight, and an irradiance: 100 mW/cm². A result in each example is shown in Table 1.

TABLE 1

|  | Conversion efficiency (%) | | | Fill factor (—) | | |
| --- | --- | --- | --- | --- | --- | --- |
|  | First time | Second time | Third time | First time | Second time | Third time |
| Example 1 | 10.3 | 11.3 | 12.0 | 0.63 | 0.67 | 0.68 |
| Example 2 | 11.1 | 11.9 | 12.1 | 0.65 | 0.68 | 0.68 |
| Comparative example | 9.8 | 11.5 | 12.3 | 0.58 | 0.67 | 0.69 |

In the examples 1 and 2, a higher conversion efficiency was obtained in a solar cell element fabricated at a first time than the comparative example. In particular, the mixture of the cleaning gas component in the formation of the semiconductor film was sufficiently reduced in the example 2 in which the preliminary film formation was carried out as compared with example 1 in which only the heating step was carried out; therefore, a higher conversion efficiency was obtained. Moreover, in the examples 1 and 2, it could be confirmed that the solar cell elements fabricated at the first time had almost equal conversion efficiencies to those of the solar cell elements fabricated at the second and third times, and the solar cell elements having stable output characteristics could be fabricated <Other Variant>

The present invention is not restricted to the embodiment described above but many modifications and changes can be made without departing from the scope of the present invention. For example, more second supply parts 6b may be provided on the central side than the end side of the branch part or the opening sectional area of the second supply part 6b may be increased toward the central portion of the branch part. Consequently, it is possible to uniformly supply the gas.

Although the description has been given by taking, as an example, the apparatus for forming deposited film provided with the electrode and the substrate in the horizontal direction, it is also possible to use an apparatus for forming deposited film provided with the electrode and the substrate in a vertical direction. By such an apparatus for forming deposited film, it is possible to form a deposited film having a uniform film thickness distribution.

Moreover, the supply part 6 provided in the second electrode 2 may include the first supply part 6a including a space for generating a Hollow Cathode discharge, and the second supply part 6b which does not generate the Hollow Cathode discharge or has a low degree of the generation of the Hollow Cathode. In other words, as shown in FIG. 11, the first supply part 6a may include a passage sectional area increased gradually toward an outlet of the gas at the outlet side of the gas in the first supply part 6a so that the Hollow Cathode discharge 60 is generated. The Hollow Cathode discharge is a kind of glow discharge in which an electron reciprocates by an electrostatic entrapment and an energy of the electron at this time is used for generating a plasma so that a plasma density is increased very greatly. The first supply part 6a of the second electrode 2 is formed to be tapered or stepwise, for example, in such a manner that a sectional area of a perpendicular surface to an axis in a depth direction is decreased with an increase in a depth, that is, the sectional area is gradually reduced apart from the first electrode 7. For this reason, the Hollow Cathode discharge is generated in a position at an optional depth in the concave portion in accordance with a magnitude of an ambient pressure in a discharge space. Moreover, the decomposition of the first material gas can be promoted more greatly by a high density plasma of the Hollow Cathode discharge in the first supply part 6a.

By the action described above, the activation of the first material gas can be promoted more greatly, and furthermore, the excessive decomposition of the second material gas can be reduced. Moreover, in the case in which a part of the first material gas supplied to the first introducing path 3a is divided and supplied into the second introducing path 3b, it is possible to promote the decomposition of the first material gas by the heating of the heated catalyzer 12 and the high density of the Hollow Cathode discharge even if an amount of the first material gas passing through the first introducing path 3a is small. Accordingly, it is possible to form a deposited film having a high quality on the substrate 10 sufficiently at a high speed.

In a formation of an SiC based wide gap film such as a-SiC (amorphous silicon carbide), in the case in which the heated catalyzer 12 is provided in the first introducing path 3a, an $H_2$ gas is supplied to the first introducing path 3a and an $SiH_4$ (silane) gas or a $CH_4$ gas is supplied to the second supply path 5 irrespective of the presence/absence of the first supply part 6a including the space for generating the Hollow Cathode discharge. As deposited film forming conditions, it is sufficient to set a gas pressure to be equal to or higher than 100 Pa and to be equal to or lower than 700 Pa and to set a high frequency power density to be equal to or higher than 0.01 W/cm² and to be equal to or lower than 0.1 W/cm². The SiC based wide gap film is utilized as a light incidence side window layer of a solar cell. For example, in a pin junction thin film solar cell comprising a p type amorphous silicon carbide film, it is sufficient to form the p-type amorphous silicon carbide film in a film thickness which is equal to or greater than 0.005 μm and is equal to or smaller than 0.03 rim, and preferably, is equal to or greater than 0.01 μm and is equal to or smaller than 0.02 μm. The SiC based wide gap film can also be utilized as a photoactive layer (an i-type layer).

Moreover, in the case in which the heated catalyzer 12 is provided in the first introducing path 3a in a formation of an SiGe based narrow gap film such as a-SiGe (amorphous silicon germanium), the $H_2$ gas is supplied to the first introducing path 3a and a Ge based gas such as the $SiH_4$ (silane) gas or a $GeH_4$ (germane) gas is supplied to the second supply path 5 irrespective of the presence/absence of the first supply part 6a including the space for generating the Hollow Cathode discharge. As the deposited film forming conditions, it is sufficient to set a gas pressure to be equal to or higher than 100 Pa and to be equal to or lower than 700 Pa and to set a high frequency power density to be 0.01 W/cm² to 0.2 W/cm². The SiGe based narrow gap film is utilized for absorbing a light having a long wavelength which cannot be absorbed by the Si film. In an [a-Si/a-SiGe/μc-Si] type triple junction thin film solar cell comprising an i-type amorphous silicon germanium film, it is sufficient to set a film thickness of the i-type amorphous silicon germanium film to be equal to or greater than 0.1 μm and to be equal to or smaller than 0.5 μm, and preferably, to be equal to or greater than 0.15 μm and to be equal to or smaller than 0.3 μm. In an [a-Si/μc-Si/μc-SiGe] type triple junction thin film solar cell comprising an i-type microcrystalline silicon germanium film, it is sufficient to set a film thickness of the i-type microcrystalline silicon germanium film to be equal to or greater than 1 μm and to be equal to or smaller than 4 μm, and preferably, to be equal to or greater than 1.5 μm and to be equal to or smaller than 3 μm.

Since the thin film solar cell is formed by a film having a high quality at a high speed through the manufacturing method described above, it is possible to enhance a productivity; thereby fabricating a solar cell having a high conversion efficiency. As such a thin film solar cell, examples include a tandem structure in which a semiconductor comprised of an amorphous silicon film and a semiconductor comprised of a microcrystalline silicon film are provided from a light receiving surface side, a triple structure in which a semiconductor comprised of an amorphous silicon film, a semiconductor comprised of an amorphous silicon germanium film and a semiconductor comprised of a microcrystalline silicon film or a semiconductor comprised of an amorphous silicon film, a semiconductor comprised of a microcrystalline silicon film and a semiconductor comprised of a microcrystalline silicon germanium film are provided, and the like. Moreover, it is sufficient that at least one of the semiconductors can be formed by the manufacturing method described above.

EXPLANATION OF DESIGNATION

1: chamber
2: second electrode
2a: electrode plate
2b: electrode substrate
3a: first introducing path
3b: second introducing path
4: first supply path
5: second supply path
51: main stream part
52: branch part
53: connecting port (connecting part)
6a: first supply part
6b: second supply part
7: first electrode
8: space
10: substrate
12: heated catalyzer (heating means)
16: cooling mechanism

The invention claimed is:

1. An apparatus for forming deposited film comprising a chamber, a first electrode positioned in the chamber and a second electrode positioned apart from the first electrode at a predetermined distance in the chamber,
    wherein the second electrode comprises an electrode substrate and a plurality of electrode plates disposed on the electrode substrate,
    wherein each of the electrode plates comprises a first supply part for supplying a first material gas to a space between the first electrode and the second electrode, a second supply part for supplying a second material gas to the space, a first supply path which is connected to the first supply part and into which the first material gas is to be introduced, and a second supply path which is connected to the second supply part and into which the second material gas is to be introduced,
    wherein the electrode substrate comprises a heater for heating the first material gas, a first introducing path for introducing the first material gas to the first supply path, and a second introducing path for introducing the second material gas to the second supply path,
    wherein the second supply path comprises a main stream part into which the second material gas is to be introduced from the second introducing path and which is not provided with the second supply part, and a plurality of branch parts into which the second material gas is to be introduced from the main stream part and which is provided with the second supply part, and
    wherein, for each electrode plate, the second introducing path connects to the main stream part at at least one edge portion of the electrode plate.

2. The apparatus for forming deposited film according to claim 1, wherein, for each electrode plate, the second introducing path connects to the main stream part at at least one edge portion that is adjacent to another electrode plate.

3. The apparatus for forming deposited film according to claim 1, wherein each of the plurality of electrode plates comprises the first introducing path.

4. The apparatus for forming deposited film according to claim 3, wherein the electrode substrate comprises a cooling mechanism for cooling the electrode substrate and/or the electrode plate.

5. The apparatus for forming deposited film according to claim 1, wherein the electrode substrate comprises a plurality of heaters.

6. The apparatus for forming deposited film according to claim 1, wherein the number of the heaters is equal to that of the electrode plates.

7. The apparatus for forming deposited film according to claim 1, wherein the electrode substrate comprises a reinforcing rib, and the plurality of electrode plates are fixed to the reinforcing rib.

8. The apparatus for forming deposited film according to claim 7, wherein the second introducing path is present in the reinforcing rib.

9. The apparatus for forming deposited film according to claim 1, wherein the heater comprises a metal wire for causing a current to flow, and the metal wire is disposed on the electrode substrate in such a manner that an area occupied by the metal wire in a central portion of the electrode plate is smaller than that in an outer peripheral portion of the electrode plate in a planar perspective view of the electrode plate.

10. The apparatus for forming deposited film according to claim 1, wherein the first supply part comprises a passage sectional area increased gradually toward an outlet at an outlet side of the first supply part in such a manner that a Hollow Cathode discharge can be generated.

\* \* \* \* \*